April 29, 1969 W. E. BRAY 3,441,914
HIGH FREQUENCY BINARY MEMORY AND LOGIC CIRCUIT
Filed July 1, 1966
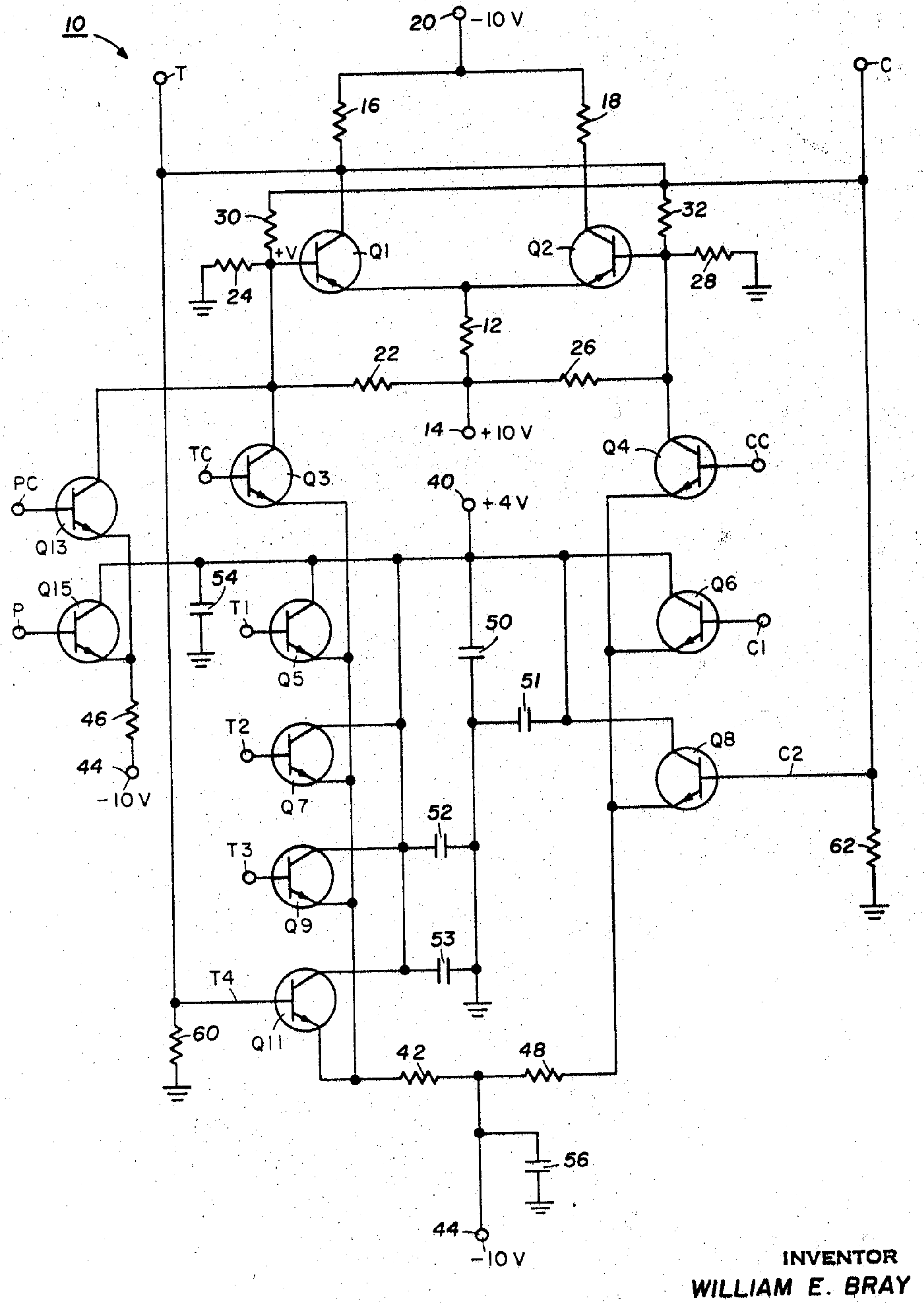
INVENTOR
WILLIAM E. BRAY
E. Mickey Hubbard
ATTORNEY United States Patent Office 3,441,914

Patented Apr. 29, 1969

3,441,914

HIGH FREQUENCY BINARY MEMORY AND LOGIC CIRCUIT

William E. Bray, Houston, Tex., assignor to Texas Instruments Incorporated, Dallas, Tex., a corporation of Delaware Filed July 1, 1966, Ser. No. 562,189
Int. Cl. G11b 9/00
U.S. Cl. 340—173 5 Claims This invenion relates generally to digital systems, and more particularly relates to a combination high speed binary stage and logic gate control circuit.

There is a pressing need and a continuing effort in the art to improve the speed at which digital systems can be operated. Data is usually stored in a digital system by means of a large number of binary stages, which are often flip-flop circuits, and decisions are made relative to the data by logic gate circuits. In order to improve the overall speed of operation of a digital system, it is important to reduce the time required for the binary stages to switch from one state to the other, and to decrease the time required for the logic gates to reach a decision. A large number of binary storage circuits and gate circuits have heretofore been proposed, including circuits which operate in the current mode as well as the saturation mode. However, all binary storage circuits and controlling logic gate circuits heretofore used or proposed have various objectionable features, and in particular do not have the desired short switching time.

Therefore, a principal object of this invention is to provide a combined binary stage and logic circuit which can be operated at very high repetition rates, one embodiment having been tested at rates in excess of 300 megacycles.

Another object of the invention is to provide a binary stage wherein either logic input can be selectively enabled by a clock pulse, or wherein both logic inputs can be simultaneously enabled by a clock pulse.

Another important object of the invention is to provide a binary stage and logic input circuit in which each of the logic outputs is compatible with any logic input.

A further important object of the invention is to provide such a circuit having no indeterminate conditions.

Another object is to provide such a circuit wherein the outputs are suitable for driving standard transmission lines and the inputs may be driven by standard transmission lines.

Still another object is to provide such a circuit which may be operated by clock pulses of various widths.

Another object of the invention is to provide such a circuit which is completely D.C. coupled and therefore has no time constants associated with capacitive coupling.

Another important object of the invention is to provide a circuit wherein the binary stage and the input logic functions are combined so as to increase the speed of the circuit.

A further object is to provide such a circuit wherein the number of logic inputs can be increased to substantially any number required.

Yet another object of the invention is to provide such a circuit wherein the collector-base junctions of all transistors in the circuit are always reverse biased so as to operate the transistors at the optimum cutoff frequency, optimum collector-base junction capacitance, optimum D.C. gain, and so that the transistors will never become saturated, all of which tends to increase the speed of operation of the circuit.

Another important object of the invention is to provide such a circuit having no offset voltage between the input and output.

A further object of the invention is to provide such a circuit having maximum temperature stability in that all active components are provided in compensating pairs.

Still another object of the invention is to provide such a circuit which is particularly suited for fabrication using either discrete components or in integrated circuit form.

These and other objects are accomplished by means of a circuit comprised of first and second storage transistors of one type, the emitters of which are common and are connected through a resistor to an emitter supply voltage, the collectors of which are connected through individual resistors to a collector supply voltage, and the bases of which are each biased by a voltage divider connected between the emitter supply voltage and ground. Positive feedback is provided from the collector of the first transistor through a resistor to the base of the second transistor, and also from the collector of the second transistor through a resistor to the base of the first transistor. The collectors of the third and fourth reference transistors of the opposite type are connected to the bases of the first and second transistors, respectively, and the emitters are connected through separate resistors to an emitter voltage supply. At least one logic input transistor is provided for each of the third and fourth reference transistors. The emitter of each logic input transistor is connected to the emitter of the respective third or fourth reference transistor and the collectors of all of the logic transistors are connected to a common collector voltage supply. The first and second memory transistors form the binary memory stage, the state of the stage being determined by which of the transistors is conducting. The first memory transistor is turned off and the binary stage thereby complemented by turning the third reference transistor on, and the second memory transistor is turned off, thereby complementing the binary, by turning the fourth reference transistor on. The third and fourth reference transistors may be selectively turned on to complement the binary stage by forward biasing the base-emitter junction of the respective reference transistor to a greater level than the forward bias across the base-emitter junction of all logic input transistors associated with the respective reference transistor. Conversely, if the base-emitter junction of any input transistor is forward biased to a greater level than the corresponding reference transistor, the corresponding reference transistor cannot be turned on.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawing, wherein:

The figure is a schematic circuit diagram of a device constructed in accordance with the present invention.

Referring now to the drawing, a circuit constructed in accordance with the present invention is indicated generally by the reference numeral 10. The active elements of the binary memorry stage are PNP transistors Q1 and Q2. The emitters of the transistors are common and are connected by a resistor 12 to a +10.0 v. emitter supply terminal 14. The collectors of transistors Q1 and Q2 are connected by equal resistors 16 and 18, respectively to a −10.0 v. collector supply terminal 20. The base of transistor Q1 is biased by a voltage divider network comprised of resistors 22 and 24 connected between the emitter supply terminal 14 and ground, and the base of transistor Q2 is similarly biased by a voltage divider formed by resistors 26 and 28 connected between the emitter supply terminal 14 and ground. The resistors 22 and 26 are equal, as are the resistors 24 and 28. A positive feedback resistor 30 interconnects the collector of transistor Q2 and the base of transistor Q1 and a feedback resistor 32 connects the collector of transistor Q1 and the base of transistor Q2.

The state of the binary stage is determined by the voltage level of the collector of memory transistors Q1 and Q2 which are connected to a true output T and a complement output C, respectively. The binary memory stage may be complemented by applying a negative pulse to the base of the memory transistor Q1 or Q2 that is turned off. A negative pulse is applied to the base of transistor Q1 by turning either reference transistor Q3 or Q13 on, and a negative pulse is applied to the base of transistor Q2 by turning reference transistor Q4 on. Reference transistor Q3 is controlled by logic input transistors Q5, Q7, Q9 and Q11, and these five transistors may be considered as part of a first true input logic gate. Reference transistor Q13 is controlled by logic input transistor Q15 and these two transistors comprise a second true input logic gate. Reference transistor Q4 is controlled by logic input transistors Q6 and Q8 and these three transistors may be considered as forming a complement logic input gate. The collector of reference transistor Q3 is connected to the base of transistor Q1. The collectors of transistors Q5, Q7, Q9 and Q11 are all connected to a +4.0 v. collector voltage supply terminal 40. The emitters of transistors Q3, Q5, Q7, Q9 and Q11 are all common and are connected through a resistor 42 to a −10.0 v. emitter voltage supply terminal 44. The base terminal of transistor Q3 is preferably the clock input for the first true input logic gate and is therefore designated TC. The bases T1, T2, T3 and T4 of transistors Q5, Q7, Q9 and Q11, respectively then form the logic inputs to the first true logic gate.

The collector of transistor Q13 is also connected to the base of transistor Q1. The collector of transistor Q15 is connected to the collector supply voltage terminal 40. The emitters of transistors Q13 and Q15 are common and are connected by a resistor 46 to the emitter supply voltage terminal 44. Transistors Q13 and Q15 are typically used to preset the binary stage to the logic "1" state. The base terminal PC of transistor Q13 is usually the clock input, and the base terminal P of transistor Q15 is the logic input.

The collector of the reference transistor Q4 is connected to the base of transistor Q2. The collectors of logic input transistors Q6 and Q8 are connected to the +4.0 v. collector supply voltage terminal 40. The emitters of transistors Q4, Q6 and Q8 are common and are connected through a resistor 48 to the emitter supply voltage terminal 44. The resistors 42, 46 and 48 have equal resistive values. The base CC of reference transistor Q4 preferably is the clock input for the complement input logic gate and the bases C1 and C2 of transistors Q6 and Q8, respectively are the logic inputs.

In order to permit inputs TC and CC to be clocked simultaneously without having an indeterminate state, the true output T is connected by resistor 60 to ground and the voltage across the resistor 60 applied to logic input T4, and the complement output C is connected by resistor 62 to ground and to logic input C2. Or, if desired, the collectors of Q1 and Q2 may be connected back to the inputs T4 and C2 by the same transmission lines used to transfer the output signal of the binary to other logic elements, in which case no terminating resistors would be required.

It is important to note that the only capacitors associated with the circuit are capacitors 50–54 which bypass the collector supply voltage terminal 40 to insure that the collector supply voltage remains constant under pulse conditions, and a capacitor 56 which bypasses the emitter supply voltage terminal 44 for the same reason. It will be noted that these capacitors are actually associated with the voltage supplies, rather than the logic circuits.

*Operation*

In accordance with an important aspect of the invention, all transistors in the circuit operate in the current switching mode, rather than in the saturation mode, and as will hereafter be discussed in greater detail, all collector-base junctions are reverse biased at all times. Therefore, although it is convenient when explaining the operation of the circuit to consider the transistors either on or off, such a reference in the following discussion is intended to refer to high and low transconductance states and is not intended to refer to the more conventional switching states of saturation and full off.

The collector of transistor Q1 is considered to be the true output of the binary stage and the collector of transistor Q2 is the complement output. Although the voltage levels may of course vary for circuits of different design, it is beneficial to a complete understanding of the operation and advantages of the circuit to select typical logic levels. In one embodiment of the invention, the logic levels of the true and complement outputs are +0.3 v. for a logic "1" level and −0.3 v. for a logic "0" level, and these values will be used in the following explanation. However, it must be appreciated that these logic levels may change depending upon the fan-out load placed on the outputs.

Assume now that transistors Q3 and Q4 are both in the low transconductance state, i.e., are turned off. Then when transistor Q1 is turned on and transistor Q2 is turned off, the values of the various resistors are chosen such that the collector of transistor Q1 and the true output T will be at approximately +0.3 v., and the collector of transistor Q2 and the complement output C will be at approximately −0.3 v. The binary is then in the logic "1" state. The binary will be held in this state because the +0.3 v. at the collector of transistor Q1 is positively fed back to the base of transistor Q2, thus holding transistor Q2 off, and the −0.3 v. at the collector of transistor Q2 is positively fed back through resistor 30 to the base of transistor Q1 to hold transistor Q1 on. On the other hand, if transistor Q2 is on and transistor Q1 is off, the collector of transistor Q2 would be at approximately +0.3 v. and the collector of transistor Q1 would be at approximately −0.3 v. and the binary would be in the logic "0" state. The binary stage is held in the logic "0" state by the +0.3 v. feedback through resistor 30 to the base of transistor Q1 and the −0.3 v. feedback through resistor 32 to the base of transistor Q2.

Assume now that transistor Q2 is on and transistor Q1 is off so that the binary is in the logic "0" state. The binary is complemented to the logic "1" state by applying a negative pulse to the base of transistor Q1 causing the transistor Q1 to switch to the higher transconductance state or be turned on as heretofore described. As the transistor Q1 begins to conduct, the rise in voltage at the collector of transistor Q1 is fed back through resistor 30 to the base of transistor Q2, thus tending to turn transistor Q2 off. This in turn reduces the voltage at the collector of transistor Q2 and the decrease is fed back through resistor 32 to the base of transistor Q1 tending to increase the rate at which transistor Q1 is turned on. As a result, transistor Q1 is very rapidly switched to the high transconductance state and transistor Q2 to the low transconductance state, thus reversing the voltage levels at outputs T and C. The binary stage can be complemented back to the logic "0" state by applying a negative pulse to the base of transistor Q2, in which case the same effects are repeated except in reverse. If the binary is in the logic "1" state and a negative pulse is applied to the base of transistor Q1, the binary does not change states. The same is true if the binary is in the logic "0" state and a negative pulse is applied to transistor Q2. If a negative pulse is applied to the bases of both transistors Q1 and Q2 simultaneously, an indeterminate state would result and this condition must be avoided.

It is very important to keep the collector-base junction of the transistors Q1 and Q2 reverse biased in order to insure that they will operate in the current switching mode rather than in the saturation mode. For this reason, the resistor biasing networks for the transistors Q1 and Q2 are selected such that the transistors are biased to the optimum operating conditions when in the high transconductance state. Then when either transistor Q1 or Q2 is operating in the low transconductance state, the feedback from the collector of the other transistor will strongly reverse bias the collector-base junction of the transistor operating in the low transconductance mode.

A negative pulse is applied to the base of transistor Q1 to set the binary stage to a logic "1" state by momentarily switching transistor Q3 from a low to a high transconductance state, i.e., by switching the transistor on. Similarly, a negative pulse is applied to the base of transistor Q2 to set the binary stage to the logic "0" state by momentarily switching transistor Q4 on. For example, when transistor Q3 is in the high transconductance state, a sufficient portion of the current which previously passed through resistors 24 and 30 is then conducted through the transistor Q3 and resistor 42 to the emitter voltage supply 44 to lower the voltage at the base of transistor Q1 to a sufficient degree to switch the binary stage. The circuit is designed such that transistor Q3 conducts sufficient current to turn transistor Q1 on only when logic input TC is more positive by about 0.3 v. than all of the inputs T1–T4. If any one of the inputs T1–T4 is more positive by 0.3 v. than input TC, then that transistor will conduct a major portion of the current that can flow through resistor 42 so that transistor Q3 cannot conduct sufficient current to turn transistor Q1 on. A negative pulse can also be applied to the base of transistor Q1 to complement the binary stage to the logic "1" state by momentarily turning transistor Q13 on. However, transistor Q13 can be turned on only if input PC is more positive by 0.3 v. than input P. If input P is more positive than input PC by 0.3 v., then transistor Q15 conducts current to the exclusion of transistor Q13. Similarly, a negative pulse can be applied to the base of transistor Q2 by momentarily turning transistor Q4 on. However, transistor Q4 can be turned on only when input CC is more positive by 0.3 v. than either input C1 or C2 for the same reasons.

In the preferred method of operating the circuit 10, the inputs TC, PC and CC are the clock inputs and are normally maintained at −0.6 v., but are brought up to ground potential during the clock pulse. The logic levels on inputs T1–T4, P, C1 and C2 are −0.3 v. for the logic "0" level and +0.3 v. for the logic "1" level. Thus a negative pulse can be applied to the base of transistor Q1 only when input TC is at ground potential during the clock pulse and all four inputs T1–T4 are at a logic "0" level of −0.3 v., or when input P is at ground potential during the clock pulse, and input P is at a logic "0" level of −0.3 v. When operated in this manner, the binary states can never be complemented to the logic "1" state except during a clock pulse either on input TC or input PC. Further, if any one of the logic inputs T1–T4 is at a logic "1" state of +0.3 v., then transistor Q3 cannot be turned on, or if input P is at a logic "1" level, then transistor Q13 cannot be turned on. Similarly, the binary can be complemented to the logic "0" state only when input CC is at ground potential during the clock pulse and both inputs C1 and C2 are at a logic "0" level of −0.3 v. If either input C1 or C2 is at a logic "1" level of +0.3 v., then transistor Q4 is disabled and cannot be turned on.

An alternative mode of operating the circuit 10 is to maintain one or more of the inputs TC, PC and CC at a reference potential, preferably at ground potential. Then transistor Q3 would be turned on anytime that the four inputs T1–T4 are all at a logic "0" level of −0.3 v., transistor Q13 would be turned on whenever input P is at a logic "0" level, and transistor Q4 would be turned on whenever both inputs C1 and C2 were at a logic "0" level. When operating in this mode, one of the logic inputs T1–T4 would normally serve as a clock input and the clock pulse would go from a normal +0.3 v. to a −0.3 v. This has the disadvantage of using a logic input for the clock, but has the advantage of increasing the tolerances allowable for the logic levels. Similarly, either C1 or C2 would normally be a clock input for the complement gate. By permanently tying input PC to ground, input P then merely becomes a preset input which when changed to a logic "0" level, presets the binary stage to the logic "1" state.

As previously mentioned, it is very important not to apply negative pulses to the base of both transistors Q1 and Q2 simultaneously since this results in an indeterminate state. For this reason, care must be taken not to apply a clock pulse to input CC simultaneously with a clock pulse applied to either input TC or PC unless care is taken to insure that at least one of the inputs T1–T4 and input P are at a logic "1" level, or that one of the inputs C1 or C2 is at a logic "1" level. The indeterminate state, at least so far as inputs T1–T4 and C1–C2 are concerned, can be avoided merely by connecting the true output T back to logic input T4 and by connecting the complement output C back to logic input C2 as illustrated in the drawing. Then when the binary is in the logic "1" state, input T4 will be at a logic "1" level and transistor Q3 will be disabled so that a negative pulse cannot be applied to the base of transistor Q1, except as a result of the operation of transistors Q13 and Q15. Similarly, if the binary is in the logic "0" state, input C2 will be at a logic "1" level and transistor Q4 will be disabled so that a negative pulse cannot be applied to the base of transistor Q2.

It should be noted that the true and complement outputs T and C are connected directly back to the logic inputs T4 and C2. This is possible because both outputs of the circuit 10 are campatible with the logic inputs. If a short duration clock pulse is used, no delay circuit is required because the circuit switches faster than the output signal is returned to the input. A wider clock pulse can be utilized if desired, however, by putting a transmission line delay between the binary outputs and the logic inputs. This is easily accomplished because the circuit is designed to both drive and be driven by a standard fifty ohm coaxial transmission line.

One important feature of the invention is that all transistors are operated in the current switching mode as a result of the selected power supplies, resistors and transistors. In one embodiment of the invention, transistors Q1 and Q2 were either type 2N3639 or 2N3640, and transistors Q3–Q9, Q11, Q13 and Q15 were type 2N3563. Resistor 12 was 392 ohms, resistors 24 and 28 were 806 ohms, resistors 30 and 32 were 294 ohms and resistors 16, 18, 22, 26, 42, 46 and 48 were all 619 ohms. Using voltage supplies as illustrated and logic levels as heretofore described, such an embodiment of the circuit was operated at repetition rates up to 340 megacycles, and the upper limit was the result of frequency limitations of the clock source, rather than as a result of a limitation of the circuit. As a result of the circuit design, the collector-base junctions of the transistors are never forward biased and all transistors operate in the current mode, rather than in the saturation mode. The transistors are operated under optimum gain conditions and only require very small signals to change transconductance of the transistors to the extent necessary to operate the circuit. The transistors are also operated at optimum cutoff frequency and at optimum conditions of collector-base junction capacitance so that the switching time is reduced to a minimum. Further, the system has good temperature stability since transistors Q1 and Q2 form a transistor pair, and since the base-emitter drop of the three reference transistors and the logic input transistors will shift to the same degree. By using one type of transistor in the binary stage and the other type of transistor in the logic gates, the outputs and inputs of the circuit are made compatible, thus requiring no intermediate stages between flip-flops which would slow down the operation of any system in which the circuit is used. Another important advantage of the circuit 10 is that the number of logic inputs can be easily increased as required. The number of inputs with each of the reference transistors could be increased to a total of four without materially changing any of the other circuit parameters. Additional reference transistors and the associated logic input transistors may be connected to the base of either memory transistor almost without limit.

Although a preferred embodiment of the invention has been described in detail, it is to be understood that various changes, substitutions and alterations can be made therein without departing from the spirit and scope of the invention as defined by the appended claims.

What is claimed is:

1. In a binary memory and logic circuit, the combination of:

- first and second memory transistors of one type, the emitters of which are common, and the collectors of which form the first and second outputs,
- first circuit means including a resistance for connecting the emitters of the first and second memory transistors to an emitter supply voltage,
- second circuit means for connecting the collectors of the first and second memory transistors through separate resistances to a collector supply voltage,
- first feedback circuit means comprising a resistance interconnecting the collector of the first memory transistor and the base of the second memory transistor,
- second feedback circuit means comprising a resistance interconnecting the collector of the second memory transistor and the base of the first memory transistor,
- first voltage divider circuit means connected between two voltage sources and to the base of the first memory transistor for biasing the base of the first memory transistor to a level to operate the transistor in the current mode,
- second voltage divider circuit means connected between two voltage sources and to the base of the second memory transistor for biasing the base of the second memory transistor to a level to operate the transistor in the current mode,
- first and second reference transistors of the other type, the collectors of which are common with the bases of the first and second memory transistors, respectively,
- first and second input transistors of said other type the emitters of which are common with the emitters of the first and second reference transistors, respectively, and the collectors of which are connectable to a collector supply voltage,
- third circuit means comprising a resistance for connecting the emitters of the first reference transistor and the first input transistor to an emitter supply voltage, and
- fourth circuit means comprising a resistance for connecting the emitters of the second reference transistor and second input transistor to an emitter supply voltage.

2. The combination defined in claim 1 wherein the transistors are biased such that the output logic levels are substantially equal to the input logic levels.

3. The combination defined in claim 1 wherein the collector-base junctions of all transistors are always reverse biased.

4. The combination defined in claim 1 wherein each of the transistors is operated at high or low transconductance states selected at substantially optimum cutoff frequency biasing levels.

5. In a binary memory and logic circuit, the combination of:

- a binary memory stage comprised of a pair of memory transistors of one type biased to operate in the current switching mode and switchable from one state to the other by pulses applied to the bases of the transistors, and
- a pair of logic input circuits each comprised of a pair of reference transistors of the opposite type and at least one logic input transistor of the opposite type for each reference transistor connected in emitter switching configuration with the respective reference transistor, the collector of each reference transistor being common with the base of one of the memory transistors for applying a switching pulse to the base of that memory transistor when the reference transistor is changed from a low transconductance state to a high transconductance state,
- the collectors of the memory transistors being the binary outputs of the circuit and the bases of logic input transistors being the logic input of the circuit, and the several transistors being biased such that the logic levels at the binary outputs are substantially the same as the logic levels at the logic inputs.

References Cited

UNITED STATES PATENTS 3,177,374 4/1965 Simonian ---------- 307—88.5

TERRELL W. FEARS, *Primary Examiner.*

U.S. Cl. X.R.

307—238; 340—172.5